(12) United States Patent
Chang

(10) Patent No.: US 9,666,569 B2
(45) Date of Patent: May 30, 2017

(54) SWITCH CIRCUIT OF CASCODE TYPE HAVING HIGH SPEED SWITCHING PERFORMANCE

(71) Applicant: ELECTRONICS AND TELECOMMUNICATIONS RESEARCH INSTITUTE, Daejeon (KR)

(72) Inventor: Woojin Chang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/815,378

(22) Filed: Jul. 31, 2015

(65) Prior Publication Data

US 2016/0247792 A1   Aug. 25, 2016

(30) Foreign Application Priority Data

Feb. 25, 2015   (KR) .................. 10-2015-0026605

(51) Int. Cl.
*H01L 25/18*   (2006.01)
*H01L 23/492*   (2006.01)
(Continued)

(52) U.S. Cl.
CPC ............ *H01L 25/18* (2013.01); *H01L 23/492* (2013.01); *H01L 23/49562* (2013.01);
(Continued)

(58) Field of Classification Search
CPC . H01L 25/18; H01L 23/492; H01L 23/49562; H01L 23/49575;
(Continued)

(56) References Cited

U.S. PATENT DOCUMENTS 6,259,618 B1 * 7/2001 Liaw .................. H01L 29/7802
257/E29.257
6,633,195 B2 * 10/2003 Baudelot ............... H01L 27/098
257/E27.069

(Continued)

OTHER PUBLICATIONS

Zhengyang Liu, et al., "Package Parasitic Inductance Extraction and Simulation Model Development for the High-Voltage Cascode GaN HEMT", IEEE Transactions on Power Electronics, vol. 29, No. 4, pp. 1977-1985, Apr. 2014.

*Primary Examiner* — Brandon S Cole
(74) *Attorney, Agent, or Firm* — Rabin & Berdo, P.C.

(57) ABSTRACT

Provided is switch circuit including first and second transistors, a source pad connected to a second node of the second transistor through a first signal path and connected to a gate node of the first transistor through a second signal path, a gate pad connected to a gate node of the second transistor through a third signal path; and a drain pad connected to a first node of the first transistor through a fourth signal path, wherein a second node of the first transistor and a first node of the second transistor are connected to each other through a fifth signal path, and the gate node of the first transistor and the second node of the second transistor are connected to each other through a sixth signal path separated from the first and second signal paths.

11 Claims, 10 Drawing Sheets

(51) Int. Cl.
*H01L 27/108* (2006.01)
*H01L 29/94* (2006.01)
*H01L 29/66* (2006.01)
*H01L 25/07* (2006.01)
*H01L 23/00* (2006.01)
*H01L 23/495* (2006.01)
*H01L 23/498* (2006.01)

(52) U.S. Cl.
CPC .. *H01L 23/49575* (2013.01); *H01L 23/49844* (2013.01); *H01L 24/49* (2013.01); *H01L 25/072* (2013.01); *H01L 2224/48177* (2013.01); *H01L 2924/00014* (2013.01); *H01L 2924/1033* (2013.01); *H01L 2924/13091* (2013.01)

(58) Field of Classification Search
CPC . H01L 23/49844; H01L 24/49; H01L 25/072; H01L 2224/48177; H01L 2924/00014; H01L 2924/1033; H01L 2924/13091
USPC .................................................. 327/365–508
See application file for complete search history.

(56) References Cited

U.S. PATENT DOCUMENTS

| | | | |
|---|---|---|---|
| 7,061,660 B1* | 6/2006 | Chen | G02B 26/001 257/E31.121 |
| 7,352,247 B2 | 4/2008 | Oh et al. | |
| 8,710,543 B2 | 4/2014 | Ichikawa | |
| 2005/0253167 A1* | 11/2005 | Wu | H01L 29/812 257/192 |
| 2008/0134646 A1 | 6/2008 | Yasuhira et al. | |
| 2012/0274388 A1* | 11/2012 | Badger | H01H 1/0094 327/478 |

* cited by examiner

SWITCH CIRCUIT OF CASCODE TYPE HAVING HIGH SPEED SWITCHING PERFORMANCE

CROSS-REFERENCE TO RELATED APPLICATIONS

This U.S. non-provisional patent application claims priority under 35 U.S.C. §119 of Korean Patent Application No. 10-2015-0026605, filed on Feb. 25, 2015, the entire contents of which are hereby incorporated by reference.

BACKGROUND

The present disclosure herein relates to a semiconductor circuit, and more particularly, to a switch circuit including first and second transistors.

Switch circuits used in a power electronic system require a high breakdown voltage, operating characteristics of normally-off, low on-resistance, a high current characteristic, and a high speed switching characteristic. In particular, when a switch circuit with a high speed switching operation enabled is used, the sizes of an inductor and capacitor of the power electronic system may be reduced and accordingly, the size and manufacturing cost of the power electronic system may be reduced. When manufactured by using a device showing an operation characteristic of normally-on, a switch circuit may have high current characteristic with a low manufacturing cost and small size. Accordingly, a research is being performed on a switch circuit having a combination of a device having a low breakdown voltage and an operation characteristic of normally-off, and a device having a high breakdown voltage and an operation characteristic of normally-on.

However, when a switch circuit is manufactured by using a plurality of devices, parasite inductance is induced by the plurality of devices and interconnections connecting the plurality of devices. The parasite inductance is a major cause disturbing an operation speed of the switch circuit.

SUMMARY

The present disclosure provides a switch circuit including reduce parasite inductance and accordingly having an improved operation speed.

An embodiment of the inventive concept provides a switch circuit including: first and second transistors; a source pad connected to a second node of the second transistor through a first signal path and connected to a gate node of the first transistor through a second signal path; a gate pad connected to a gate node of the second transistor through a third signal path; and a drain pad connected to a first node of the first transistor through a fourth signal path, wherein a second node of the first transistor and a first node of the second transistor are connected to each other through a fifth signal path, and the gate node of the first transistor and the second node of the second transistor are connected to each other through a sixth signal path separated from the first and second signal paths.

In an embodiment, the second transistor may include: a conductive plate on a substrate; a drain terminal disposed on the conductive plate and electrically connected to the conductive plate; a first active area on the drain terminal; a gate terminal in a first portion on the first active area; and a source terminal in a second portion of the first active area.

In an embodiment, the first signal path may include an interconnection connecting the source terminal of the second transistor and the source pad, and the third signal path may include an interconnection connecting the gate terminal of the second transistor and the source pad.

In an embodiment, the first transistor may includes: a second active area in a second portion on the substrate; a gate terminal in a first portion on the second active area; a drain terminal in a second portion on the second active area; and a source terminal in a third portion of the second active area.

The second signal path may include an interconnection connecting the gate terminal of the first transistor and the source pad, and the fourth signal path may include an interconnection connecting the drain terminal of the first transistor and the drain pad.

The fifth signal path may include an interconnection connecting the source terminal of the first transistor and the conductive plate.

The sixth signal path may include an interconnection connecting the gate terminal of the first transistor and the source terminal of the second transistor.

The first transistor may include a second active area in a second portion of the conductive plate; a gate terminal in a first portion on the second active area; a drain terminal in a second portion on the second active area; and a source terminal in a third portion of the second active area.

The fifth signal path may include an interconnection connecting the source terminal of the first transistor and the conductive plate.

The fifth signal path may include via contact penetrating the second active area to contact the source terminal of the first transistor and the conductive plate.

The first transistor may include a gallium nitride (GaN) transistor of a normally-on type.

The second transistor may include a metal oxide transistor (MOSFET) of a normally-off type.

The switch circuit may further include a third transistor connected to the first transistor in parallel and commonly controlled with the first transistor.

The switch circuit may further include a fourth transistor connected to the second transistor in parallel and commonly controlled with the second transistor.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, exemplary embodiments of the inventive concept will be described in detail with reference to the accompanying drawings.

Figure 1:
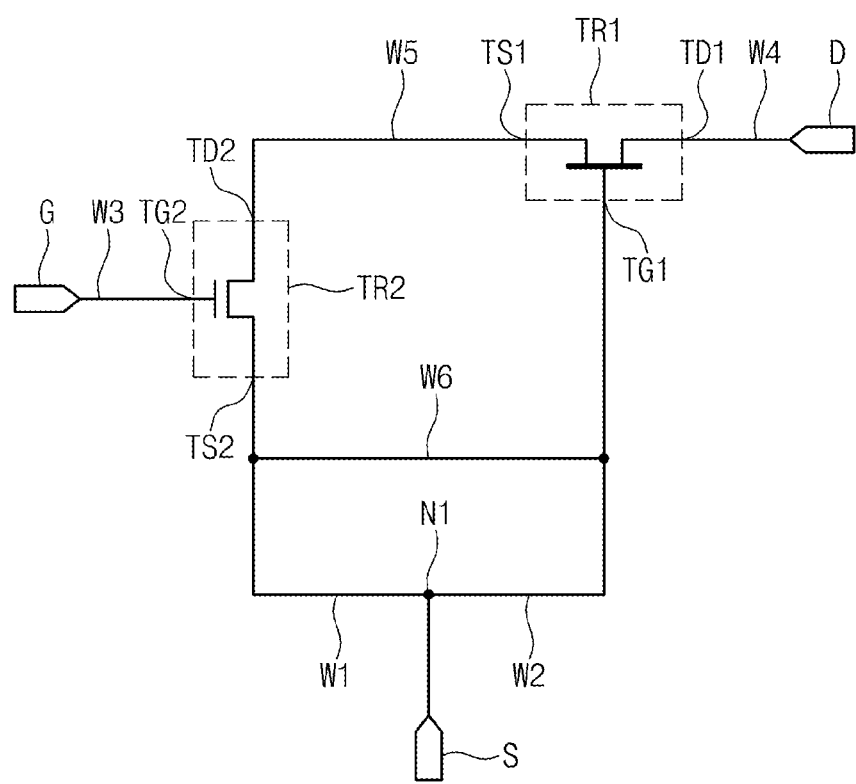
FIG. 1 is a circuit diagram of a switch circuit according to an embodiment of the inventive concept.

FIG. 1 is a circuit diagram of a switch circuit 100 according to an embodiment of the inventive concept. Referring to FIG. 1, a switch circuit 100 includes a first transistor TR1, a second transistor TR2, a drain pad D, a gate pad G, and a source pad S.

The first transistor TR1 includes a first gate TG1, a first source TS1, and a first drain TD1. The first drain TD1 is connected to the drain pad D through a fourth signal path W4. The first source TS1 is connected to the second transistor TR2 through a fifth signal path W5. The first gate TG1 is connected to a first node N1 through a second signal path W2. The first transistor TR1 may have a high breakdown voltage and an operation characteristic of normally-on. The first transistor TR1 may be a field effect transistor (FET) including gallium nitride (GaN), silicon carbide (SiC), or the like.

The second transistor TR2 includes a second gate TG2, a second drain TD2, and a second source TS2. The second drain TD2 is connected to the first source TS1 of the first transistor TR1 through a fifth signal path W5. The second gate TG2 is connected to the gate pad G through a third signal path W3. The second source TS2 is connected to the first node N1 through a first signal path W1. The second transistor TR2 may have a low breakdown voltage and an operation characteristic of normally-off. The second transistor TR2 may be a field effect transistor (FET) including gallium nitride (GaN), silicon carbide (SiC), or the like.

The first node N1 is connected to the source pad S. The drain pad D, source pad S, and gate pad G may be input and output pads of the switch circuit 100.

The switch circuit 100 may further include a sixth signal path W6 for connecting the first gate TG1 of the first transistor TR1 and the second source TS2 of the second transistor TR2. The sixth signal path W6 may be an additional signal path separated from the first signal path W1 or the second signal path W2. The sixth signal path W6 may not be directly connected to the source pad S and may bypass the source pad S. When the sixth signal path W6 is provided, parasitic inductance of the switch circuit 100 is reduced and the high speed switching characteristic of the switch circuit 100 is improved. The sixth signal path W6 will be described in more detail with reference to FIGS. 3 to 6.

Figure 2:
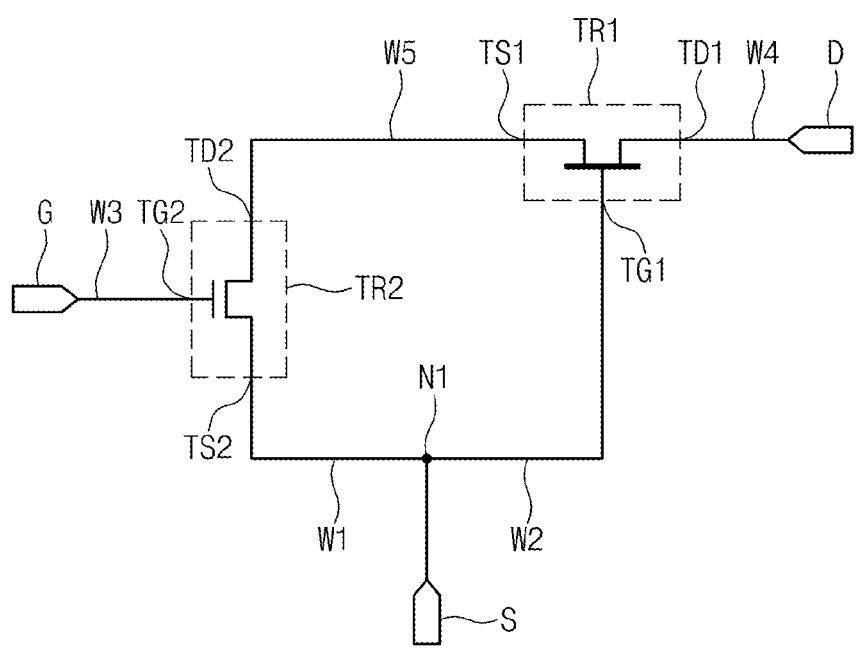
FIG. 2 is a circuit diagram of a switch circuit according to a typical embodiment.

FIG. 2 is a circuit diagram of a switch circuit 200 according to a typical embodiment. Referring to FIG. 2, a switch circuit 200 includes a first transistor TR1, a second transistor TR2, a drain pad D, a gate pad G, and a source pad S. Compared to the switch circuit 100 of FIG. 1, the sixth signal path W6 is not provided to the switch circuit 200.

Figure 3:
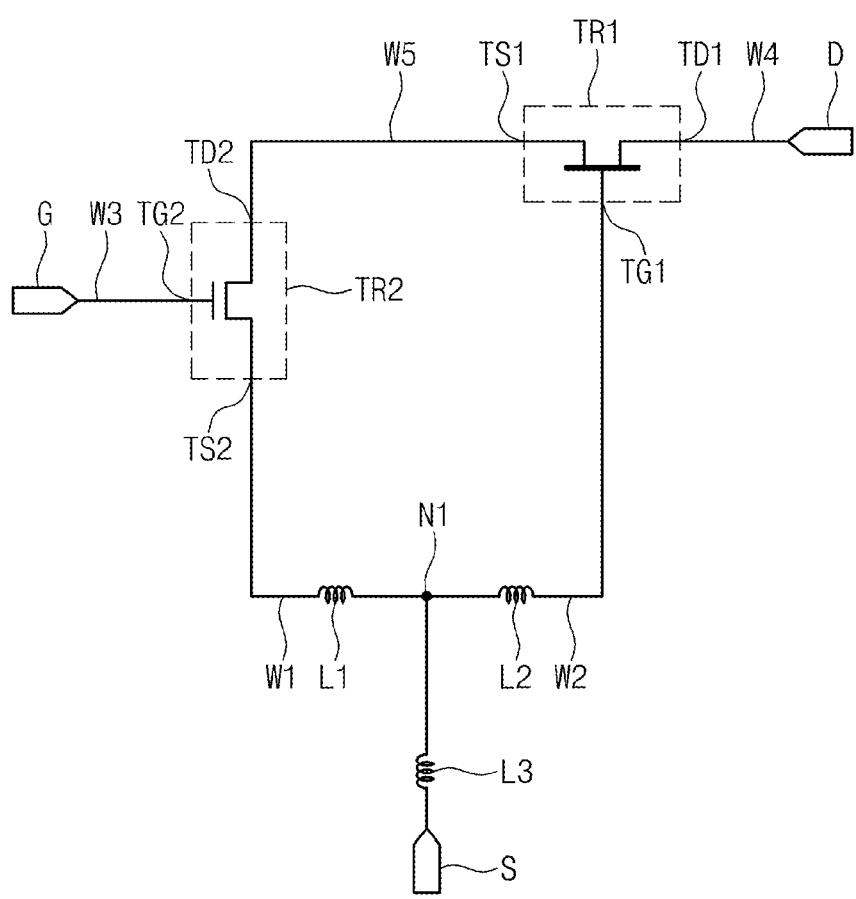
FIG. 3 illustrates an example that source pad related parasite inductances are reflected in the switch circuit of FIG. 2.

FIG. 3 illustrates an example of a switch circuit 200' that parasite inductances related to the source pad S are reflected in the switch circuit 200 of FIG. 2. Referring to FIGS. 2 and 3, the parasite inductance of the first signal path W1 is reflected in the first inductance L1. The parasite inductance of the second signal path W2 is reflected in the second inductance L2. The parasite inductance of the source pad S is reflected in a third inductance L3.

Figure 4:
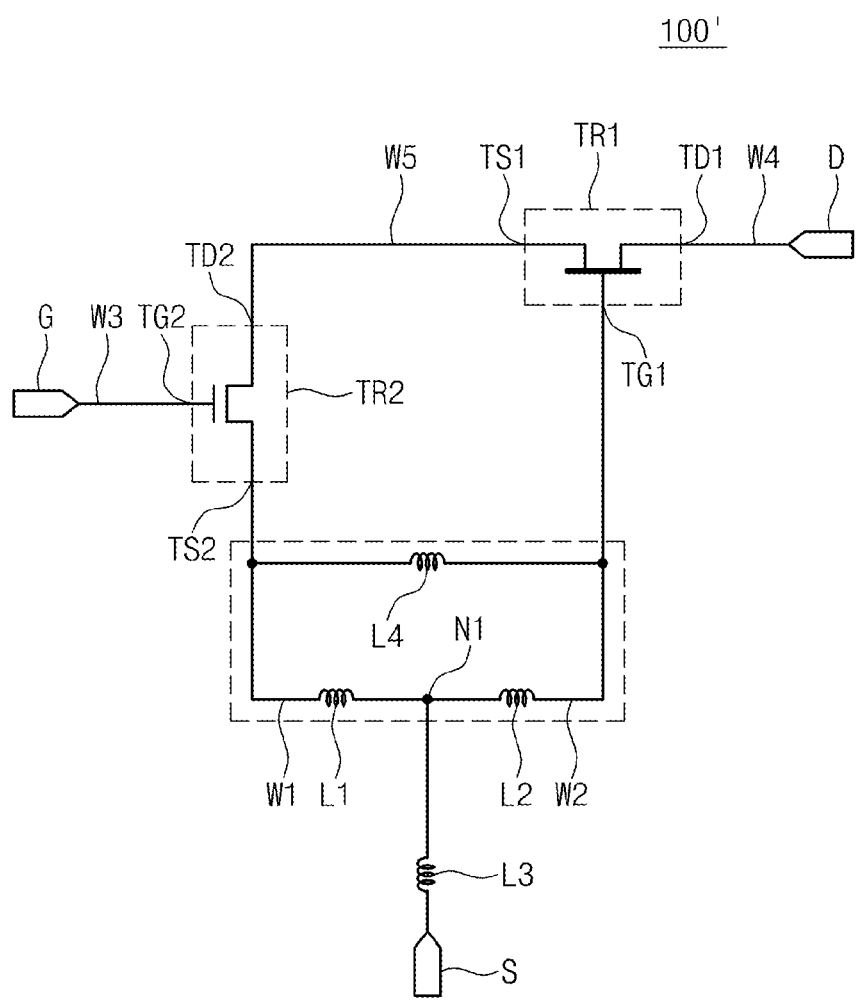
FIG. 4 illustrates an example that source pad related parasite inductances are reflected in the switch circuit of FIG. 1.

FIG. 4 illustrates an example of a switch circuit 100' that parasite inductances related to the source pad S are reflected in the switch circuit 100 of FIG. 1. Referring to FIGS. 1 and 4, the parasite inductance of the first signal path W1 is reflected in the first inductance L1. The parasite inductance of the second signal path W2 is reflected in the second inductance L2. The parasite inductance of the source pad S is reflected in a third inductance L3. The parasite inductance of the sixth signal path W6 is reflected in a fourth inductance L4.

Compared to the switch circuit 200' of FIG. 3, the switch circuit 100' further includes the fourth inductance L4 by the sixth signal path W6.

Figure 5:
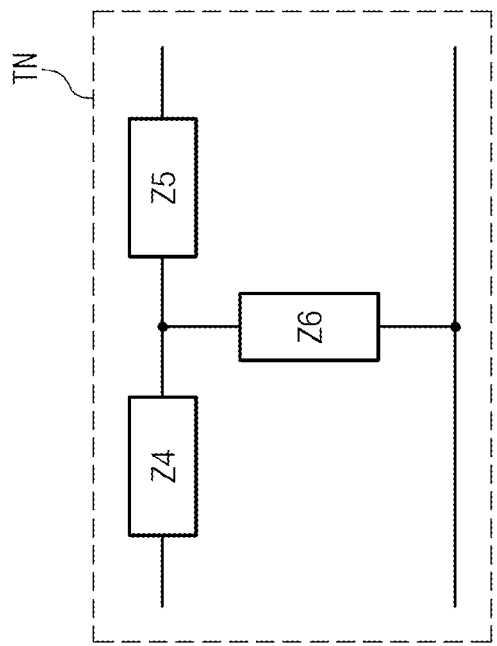
FIG. 5 illustrates an example that a pi network is converted to a T network.
Figure 5:
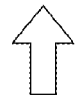
Figure 5:
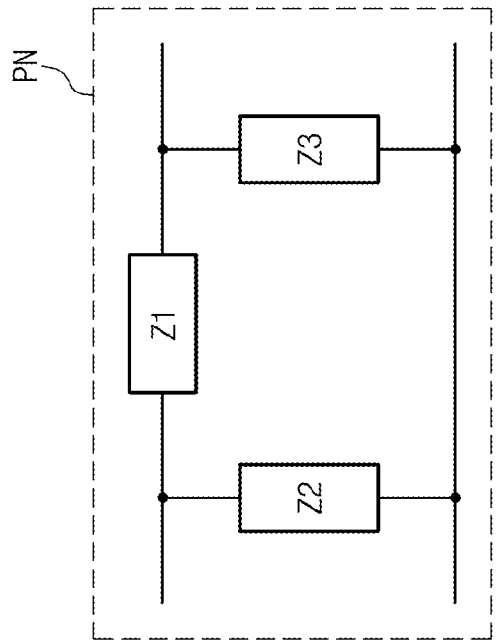

FIG. 5 illustrates an example that a pi network PN is converted to a T network TN. Referring FIG. 5, the pi network PN including first to third impedances Z1 to Z3 may be converted to the T network TN including fourth to sixth impedances Z4 to Z6. The fourth impedance Z4 may be calculated with the first to third impedances Z1 to Z3 according to Equation (1).

$$Z4 = \frac{Z1 \cdot Z2}{Z1 + Z2 + Z3} \quad (1)$$

The fifth impedance Z5 may be calculated with the first to third impedances Z1 to Z3 according Equation (2).

$$Z5 = \frac{Z1 \cdot Z3}{Z1 + Z2 + Z3} \quad (2)$$

The sixth impedance Z6 may be calculated with the first to third impedances Z1 to Z3 according to Equation (3).

$$Z6 = \frac{Z2 \cdot Z3}{Z1 + Z2 + Z3} \quad (3)$$

Figure 6:
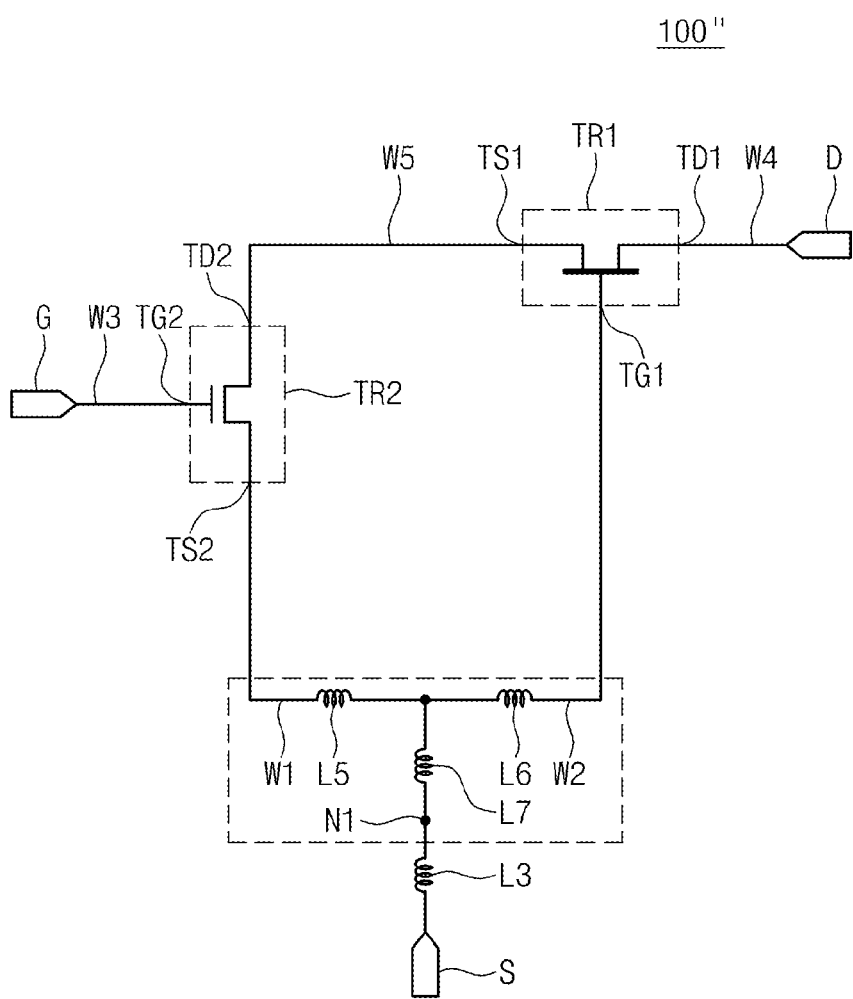
FIG. 6 illustrates an example that the switch circuit of FIG. 4 is converted according to the conversion example of FIG. 5.

FIG. 6 illustrates an example that the switch circuit 100' of FIG. 4 is converted according to the conversion example of FIG. 5. Referring to FIGS. 4 and 6, the inductances L1, L2, and L4 constructing the pi network of the switch circuit 100' may be converted to inductances L5, L6, and L7 constructing the T network of the switch circuit 100'. On the basis of Equation (1), the fifth inductance L5 is calculated according to Equation (4).

$$L5 = \frac{L1 \cdot L4}{L1 + L2 + L4} \quad (4)$$

On the basis of Equation (2), the sixth inductance L6 is calculated according to Equation (5).

$$L6 = \frac{L2 \cdot L4}{L1 + L2 + L4} \quad (5)$$

On the basis of Equation (3), the seventh inductance L7 is calculated according to Equation (6).

$$L7 = \frac{L1 \cdot L2}{L1 + L2 + L4} \quad (6)$$

Hereinafter, the parasite inductances of the switch circuits 100" and 200' are compared to each other with reference to FIGS. 3 and 6. Parasite inductance between the second transistor TR2 of the switch circuit 200' and the first node N1 is the first inductance L1. Parasite inductance between the second transistor TR2 of the switch circuit 100" and the first node N1 is the fifth and seventh inductances L5 and L7. At a position corresponding to the first inductance L1 of the switch circuit 200', inductance L1' of the switch circuit 100" is calculated according to Equation (7).

$$L1' = L5 + L7 = \frac{L2 + L4}{L1 + L2 + L4} L1 \quad (7)$$

As calculated in Equation (7), parasite inductance between the second transistor TR2 of the switch circuit 100" and the first node N1 is smaller than that between the second transistor TR2 of the switch circuit 200' and the first node N1.

Parasite inductance between the first transistor TR1 of the switch circuit 200' and the first node N1 is the second inductance L2. Parasite inductances between the first transistor TR1 100" of the switch circuit 100" and the first node N1 are the sixth and seventh inductances L6 and L7. At a position corresponding to the first inductance L2 of the switch circuit 200', inductance L2' of the switch circuit 100" is calculated with the following Equation (8).

$$L2' = L6 + L7 = \frac{L1 + L4}{L1 + L2 + L4} L2 \quad (8)$$

As calculated in Equation (8), parasite inductance between the first transistor TR1 of the switch circuit 100" and the first node N1 is smaller than that between the first transistor TR1 of the switch circuit 200' and the first node N1.

Figure 7:
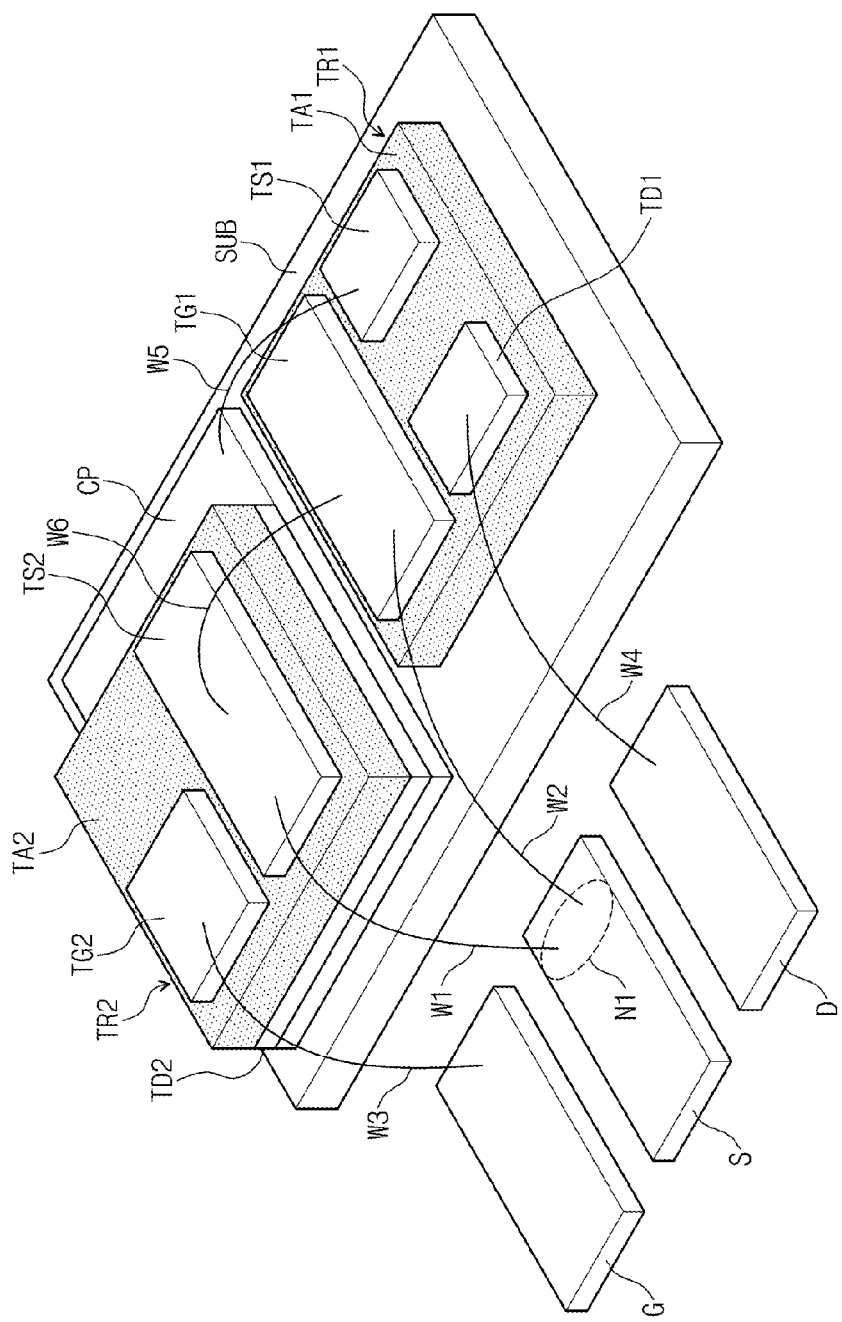
FIG. 7 is a structure of a switch circuit according to a first embodiment of the inventive concept.

In other words, as illustrated in FIGS. 3 and 6, the parasite inductance of the switch circuit 100 is smaller than that of switch circuit 200 by providing the sixth signal path W6 to the switch circuit 100. Accordingly, the high speed switching characteristic of the switch circuit 100 is improved than that of the switch circuit 200, FIG. 7 is a structure of the switch circuit 100 according to a first embodiment of the inventive concept. Referring to FIGS. 1 and 7, the first and second transistors TR1 and TR2 are disposed on a substrate SUB. The substrate SUB may include an insulating material or a conductive material. When the substrate SUB includes the conductive material, an insulation film, which separates the substrate SUB from the first and second transistors TR1 and TR2, may be provided on the substrate SUB.

The first transistor TR1 includes a first active area TA1 disposed in a first portion on the substrate SUB. The first active area TA1 may include source and drain areas doped in a first type (i.e. P type or N type), and a channel area doped in a second type (i.e. N type or P type). The first transistor TR1 includes a first gate terminal TG1, a first drain terminal TD1, and a first source terminal TS1 disposed on different areas on the first active area TA1. The first gate terminal TG1 may be disposed adjacent to the channel area of the first active area TA1. The first drain terminal TD1 may be connected to the drain area of the first active area TA1. The first source terminal TS1 may be connected to the source area of the first active area TA1. Since the configuration of the first active area TA1 is known to those skilled in the art, a detailed description thereabout will be omitted.

The second transistor TR2 includes a conductive plate CP disposed in a second portion of the substrate SUB, a second drain terminal TD2 disposed in a certain area on the conductive plate CP, a second active area TA2 disposed on the second drain terminal TD2, and second gate and source terminals TG2 and TS2 disposed in different areas on the second active area TA2. The second active area TA2 may include a source area doped in a first type (i.e. P type or N type), and a channel area doped in a second type (i.e. N type or P type). The second gate terminal TG2 may be disposed adjacent to the channel area of the second active area TA2. The second drain terminal TD2 may be connected to the drain area of the second active area TA2. The second source terminal TS2 may be connected to the source area of the second active area TA2. The configuration of the second active area TA2 is known to those skilled in the art, and a detailed description thereabout will be omitted.

The first signal path W1 may be an interconnection, for example, a bonding wire, connecting the second source terminal TS2 of the second transistor TR2 and the source pad S. The second signal path W2 may be an interconnection connecting the first gate terminal TG1 of the first transistor TR1 and the source pad S. An area of the source pad S in which the first and second signal paths W1 and W2 are connected may construct a first node N1.

The third signal path W3 may be an interconnection connecting the second gate terminal TG2 of the second transistor TR2 and the gate pad G. The fourth signal path W4 may be an interconnection connecting the first drain terminal TD1 of the first transistor TR1 and the drain pad D. The fifth signal path W5 may be an interconnection connecting the first source terminal TS1 of the first transistor TR1 and the conductive plate CP. The sixth signal path W6 may be an interconnection connecting the first gate terminal TG1 of the first transistor TR1 and the second source terminal TS2 of the second transistor TR2.

Figure 8:
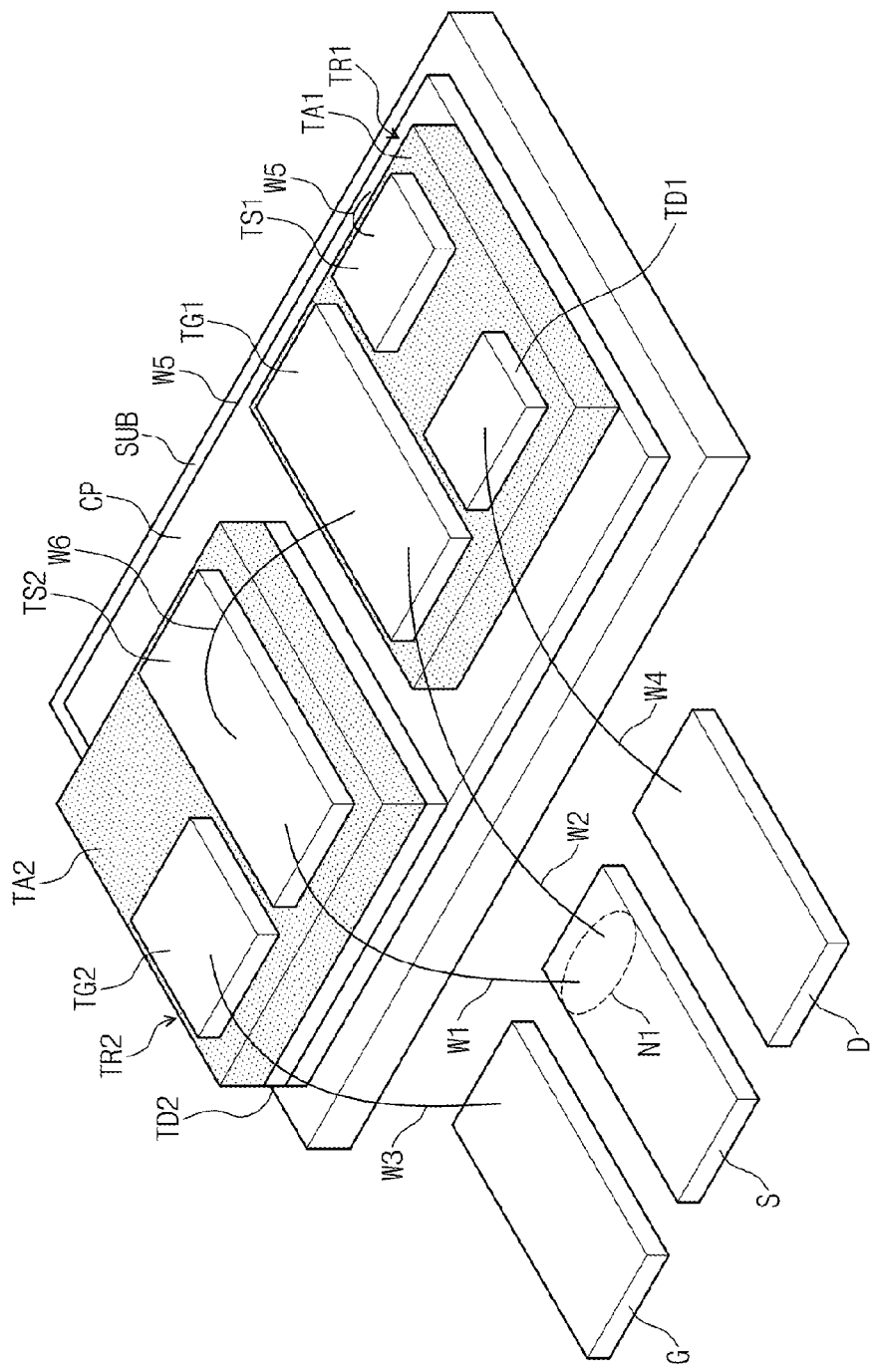
FIG. 8 is a structure of a switch circuit according to a second embodiment of the inventive concept.

FIG. 8 is a structure of the switch circuit 100 according to a second embodiment of the inventive concept. Compared to FIG. 7, the transistor TR1 may be disposed in a first portion of the conductive plate CP and the second transistor TR2 may be disposed in a second portion of the conductive plate CP.

When the conductive plate CP extends to a bottom portion of the first transistor TR1, the length of the fifth signal path W5 for connecting the first source TS1 of the first transistor TR1 and the conductive plate CP is reduced. Accordingly, the parasite inductance of the switch circuit 100 is further reduced.

Figure 9:
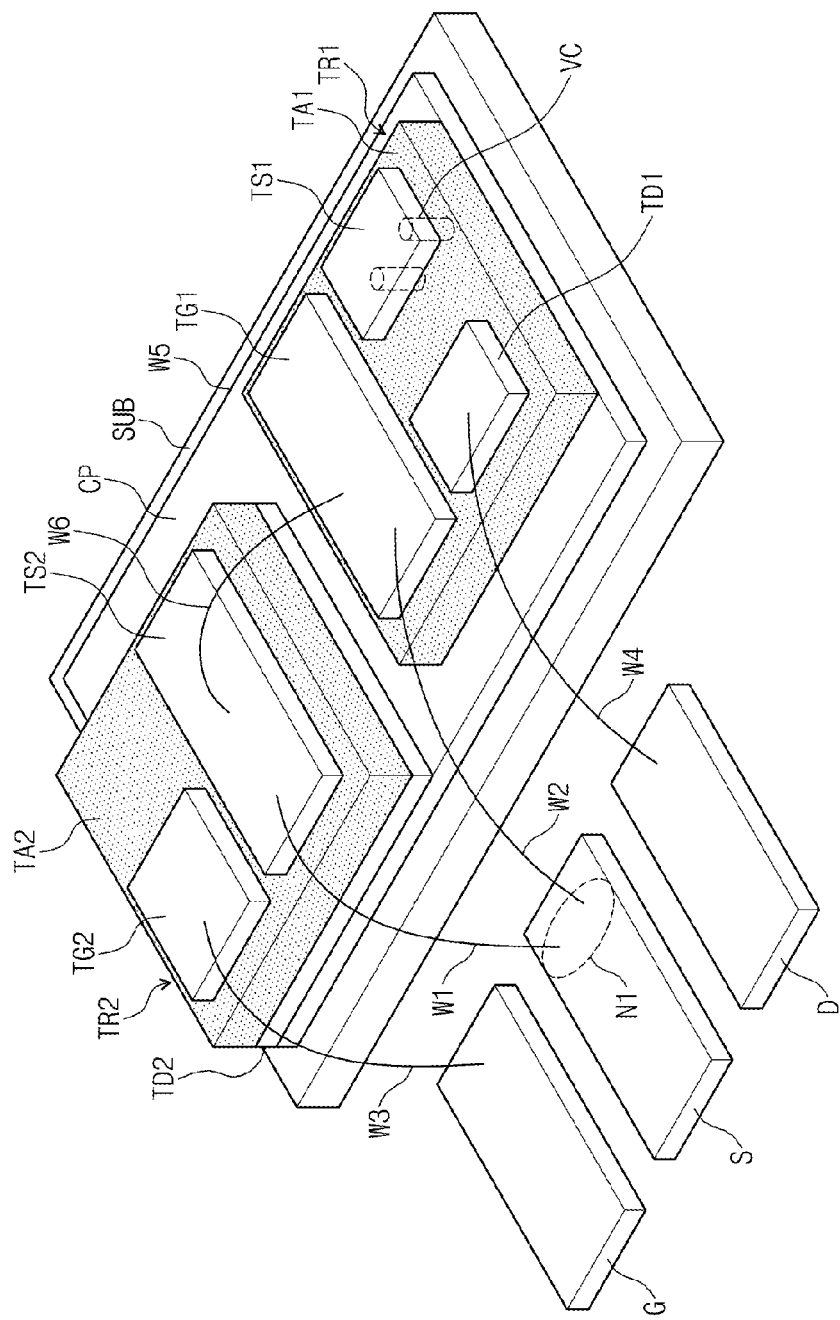
FIG. 9 is a structure of a switch circuit according to a third embodiment of the inventive concept.

FIG. 9 is a structure of the switch circuit 100 according to a third embodiment of the inventive concept. Compared to FIG. 8, the fifth signal path W5 may be formed as at least one via contact penetrating the first active area TA1 of the first transistor TR1 to contact the conductive plate CP and the first drain terminal TD1. When the fifth signal path W5 is implemented with the at least one via contact, the parasite inductance of the switch circuit 100 is further reduced than a case where the fifth signal path W5 is implemented with an interconnection.

In FIGS. 7 to 9, it is described that the first and second transistors TR1 and TR2 are directly connected to the gate pad G, drain pad D, and source pad S through the first to fourth signal paths W1 to W4. However, the first and second transistors TR1 and TR2 may be mounted on a substrate (e.g. a printed circuit board). The first and second transistors TR1 and TR2 may be manufactured to be connected to the substrate through bonding pads, and then connected to the gate pad G, drain pad D, and source pad S through interconnections printed on the substrate.

Figure 10:
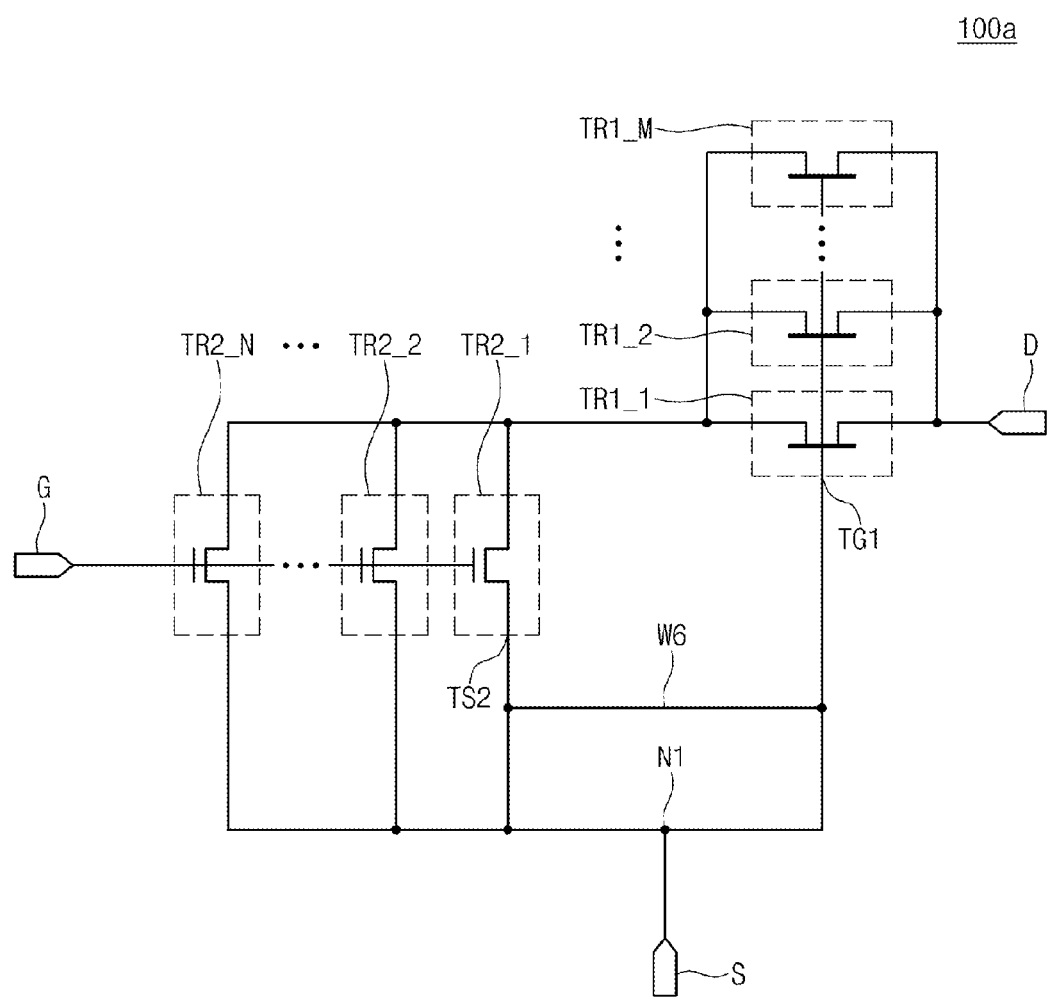
FIG. 10 is a circuit diagram of a switch circuit according to another embodiment of the inventive concept

FIG. 10 is a circuit diagram of a switch circuit 100a according to an embodiment of the inventive concept. Referring to FIG. 10, a switch circuit 100 includes a plurality of first transistors TR1_1 to TR1_M, a plurality of second transistors TR2_1 to TR2_N, a drain pad D, a gate pad G, and a source pad S. Compared to the switch circuit 100 of FIG. 1, the switch circuit 100a includes the plurality of first transistors TR1_1 to TR1_M connected in parallel and the plurality of second transistors TR2_1 to TR2_N connected in parallel. Accordingly, a current amount transferable by the switch circuit 100a increases.

The sixth signal path W6 may be connected to the first gate terminal TG1 of the first transistor TR1_1 and the second source terminal TS2 of the second transistor TR2_1. However, the technical idea of the inventive concept is not limited hereto. For example, interconnections may be provided to the switch circuit 100a, where the interconnections connect the first gate TG1 of the first transistor TR1_i, where i is a positive integer of 1 to M, and the second source TS2 of the second transistor TR2_j, where j is a positive integer of 1 to N.

The switch circuit 100a may include a plurality of signal paths. For example, the signal paths (the interconnections described in relation to FIGS. 7 to 9) may be provided to the switch circuit 100a, where the signal paths connect the first gates TG1 of the first transistors TR1, namely p where p is a positive integer, and the second sources TS2 of the second transistors TR2, namely q where q is a positive integer.

According to embodiments, a switch circuit is provided which includes an additional interconnection connecting a gate of a first transistor and a source of a second transistor. Since the parasite inductance of the switch circuit is reduced by the additional interconnection, high speed switching characteristic of the switch circuit is improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A switch circuit comprising:
   first and second transistors;
   a source pad connected to a second node of the second transistor through a first signal path and connected to a gate node of the first transistor through a second signal path,
   a gate pad connected to a gate node of the second transistor through a third signal path; and
   a drain pad connected to a first node of the first transistor through a fourth signal path,
   wherein a second node of the first transistor and a first node of the second transistor are connected to each other through a fifth signal path, and
   wherein the gate node of the first transistor and the second node of the second transistor are connected to each other through a sixth signal path,
   wherein the second transistor comprises:
      a conductive plate on a substrate;
      a drain terminal disposed on the conductive plate and electrically connected to the conductive plate, the drain terminal forming the first node of the second transistor;
      a first active area on the drain terminal;
      a gate terminal in a first portion on the first active area, the gate terminal forming the gate node of the second transistor; and
      a source terminal in a second portion of the first active area, the source terminal forming the second node of the second transistor,
   wherein the first signal path comprises an interconnection connecting the source terminal of the second transistor and the source pad, and
   wherein the third signal path comprises an interconnection connecting the gate terminal of the second transistor and the source pad.

2. The switch circuit of claim 1, further comprising a third transistor connected to the first transistor in parallel and commonly controlled with the first transistor.

3. The switch circuit of claim 1, further comprising a fourth transistor connected to the second transistor in parallel and commonly controlled with the second transistor.

4. The switch circuit of claim 1, wherein the first signal path, the second signal path, and the sixth signal path form a pi network with parasitic inductances.

5. A switch circuit, comprising:
   first and second transistors;
   a source pad connected to a second node of the second transistor through a first signal path and connected to a gate node of the first transistor through a second signal path;
   a gate pad connected to a gate node of the second transistor through a third signal path; and
   a drain pad connected to a first node of the first transistor through a fourth signal path,
   wherein a second node of the first transistor and a first node of the second transistor are connected to each other through a fifth signal path,
   wherein the gate node of the first transistor and the second node of the second transistor are connected to each other through a sixth signal path,
   wherein the second transistor comprises:
      a conductive plate on a substrate;
      a drain terminal disposed on the conductive plate and electrically connected to the conductive plate, the drain terminal forming the first node of the second transistor;
      a first active area on the drain terminal;
      a gate terminal in a first portion on the first active area, the gate terminal forming the gate node of the second transistor; and
      a source terminal in a second portion of the first active area, the source terminal forming the second node of the second transistor, and wherein the first transistor comprises:
   a second active area in a second portion on the substrate;
   a gate terminal in a first portion on the second active area, the gate terminal of the first transistor forming the gate node of the first transistor;
   a drain terminal in a second portion on the second active area, the drain terminal of the first transistor forming the first node of the first transistor; and
   a source terminal in a third portion of the second active area, the source terminal of the first transistor forming the second node of the first transistor.

6. The switch circuit of claim 5, wherein the second signal path comprises an interconnection connecting the gate terminal of the first transistor and the source pad, and
   the fourth signal path comprises an interconnection connecting the drain terminal of the first transistor and the drain pad.

7. The switch circuit of claim 5, wherein the fifth signal path comprises an interconnection connecting the source terminal of the first transistor and the conductive plate.

8. The switch circuit of claim 5, wherein the sixth signal path comprises an interconnection connecting the gate terminal of the first transistor and the source terminal of the second transistor.

9. A switch circuit, comprising:
   first and second transistors;
   a source pad connected to a second node of the second transistor through a first signal path and connected to a gate node of the first transistor through a second signal path;
   a gate pad connected to a gate node of the second transistor through a third signal path; and
   a drain pad connected to a first node of the first transistor through a fourth signal path,
   wherein a second node of the first transistor and a first node of the second transistor are connected to each other through a fifth signal path,
   wherein the gate node of the first transistor and the second node of the second transistor are connected to each other through a sixth signal path,
   wherein the second transistor comprises:
      a conductive plate on a substrate;
      a drain terminal disposed on the conductive plate and electrically connected to the conductive plate, the drain terminal forming the first node of the second transistor;
      a first active area on the drain terminal;
      a gate terminal in a first portion on the first active area, the gate terminal forming the gate node of the second transistor; and
   a source terminal in a second portion of the first active area, the source terminal forming the second node of the second transistor, and
   wherein the first transistor comprises:
      a second active area in a second portion of the conductive plate;
      a gate terminal in a first portion on the second active area, the gate terminal of the first transistor forming the gate node of the first transistor;
      a drain terminal in a second portion on the second active area, the drain terminal of the first transistor forming the first node of the first transistor; and
      a source terminal in a third portion of the second active area, the source terminal of the first transistor forming the second node of the first transistor.

10. The switch circuit of claim 9, wherein the fifth signal path comprises an interconnection connecting the source terminal of the first transistor and the conductive plate.

11. The switch circuit of claim 9, wherein the fifth signal path comprises via contact penetrating the second active area to contact the source terminal of the first transistor and the conductive plate.

* * * * *